(12) United States Patent
Alperstein et al.

(10) Patent No.: US 9,570,564 B2
(45) Date of Patent: Feb. 14, 2017

(54) SELF-ALIGNED EMITTER-BASE BIPOLAR JUNCTION TRANSISTOR WITH REDUCED BASE RESISTANCE AND BASE-COLLECTOR CAPACITANCE

(71) Applicant: GLOBALFOUNDRIES INC., Grand Cayman (KY)

(72) Inventors: Deborah A. Alperstein, Essex Junction, VT (US); David L. Harame, Essex Junction, VT (US); Alvin J. Joseph, Williston, VT (US); Qizhi Liu, Lexington, MA (US); Keith J. Machia, Swanton, VT (US); Christa R. Willets, Jericho, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 106 days.

(21) Appl. No.: 14/451,716

(22) Filed: Aug. 5, 2014

(65) Prior Publication Data
US 2016/0043203 A1 Feb. 11, 2016

(51) Int. Cl.
*H01L 29/66* (2006.01)
*H01L 29/417* (2006.01)
*H01L 29/732* (2006.01)
*H01L 29/08* (2006.01)
*H01L 29/10* (2006.01)
H01L 29/423 (2006.01)
H01L 29/737 (2006.01)

(52) U.S. Cl.
CPC ..... *H01L 29/41708* (2013.01); *H01L 29/0821* (2013.01); *H01L 29/0826* (2013.01);
(Continued)

(58) Field of Classification Search
CPC ............... H01L 29/41708; H01L 29/66272; H01L 29/1004; H01L 29/0821; H01L 29/0826; H01L 29/732; H01L 29/66242; H01L 29/42304; H01L 29/7371
(Continued)

(56) References Cited

U.S. PATENT DOCUMENTS 5,087,580 A 2/1992 Eklund
5,665,614 A 9/1997 Hafizi et al.
(Continued)

OTHER PUBLICATIONS

J. J. Benoit et al., "Bipolar junction transistors with self-aligned terminals," U.S. Appl. No. 14/070,989, filed Nov. 4, 2013.
(Continued)

*Primary Examiner* — Asok K Sarkar
*Assistant Examiner* — Dmitriy Yemelyanov
(74) *Attorney, Agent, or Firm* — Thompson Hine LLP; Anthony Canale (57) ABSTRACT

Device structures and fabrication methods for a bipolar junction transistor. A first semiconductor layer is formed on a substrate containing a first terminal. An etch stop layer is formed on the first semiconductor layer, and a second semiconductor layer is formed on the etch stop layer. The second semiconductor layer is etched to define a second terminal at a location of an etch mask on the second semiconductor layer. A first material comprising the etch stop layer and a second material comprising the second semiconductor layer are selected such that the second material of the second semiconductor layer etches at a greater etch rate than the first material of the etch stop layer. The first semiconductor layer may be a base layer that is used to form an intrinsic base and an extrinsic base of the bipolar junction transistor.

18 Claims, 7 Drawing Sheets

(52) U.S. Cl.
CPC .... H01L 29/1004 (2013.01); H01L 29/66272 (2013.01); H01L 29/732 (2013.01); *H01L 29/42304* (2013.01); *H01L 29/66242* (2013.01); *H01L 29/7371* (2013.01)

(58) Field of Classification Search
USPC ........................................................ 438/320
See application file for complete search history.

(56) References Cited

U.S. PATENT DOCUMENTS

| | | | |
|---|---|---|---|
| 6,870,184 B2 | 3/2005 | Li et al. | |
| 7,002,190 B1 | 2/2006 | Geiss et al. | |
| 7,190,046 B2 | 3/2007 | Akatsu et al. | |
| 7,326,983 B2 | 2/2008 | Steegen et al. | |
| 7,709,338 B2 | 5/2010 | Liu et al. | |
| 8,405,186 B2 | 3/2013 | Camillo-Castillo et al. | |
| 2012/0228611 A1* | 9/2012 | Chan ................. | H01L 29/66272 257/51 |
| 2013/0119436 A1* | 5/2013 | Chan ................. | H01L 29/66272 257/197 |

OTHER PUBLICATIONS

K. Lee et al., "New collector undercut technique using a SiN sidewall for low base contact resistance in InP/InGaAs SHBTs," IEEE Transactions on Electron Devices, vol. 49, No. 6, 2002, pp. 1079-1082.

\* cited by examiner

SELF-ALIGNED EMITTER-BASE BIPOLAR JUNCTION TRANSISTOR WITH REDUCED BASE RESISTANCE AND BASE-COLLECTOR CAPACITANCE

BACKGROUND

The invention relates generally to semiconductor devices and integrated circuit fabrication and, in particular, to fabrication methods and device structures for a bipolar junction transistor.

Bipolar junction transistors may be found, among other end uses, in high-frequency and high-power applications. In particular, bipolar junction transistors may be used in microwave power amplifiers used in wireless communications systems and power amplifiers in mobile devices. Bipolar junction transistors may also be used in high-speed logic circuits.

Bipolar junction transistors are three-terminal electronic devices that include semiconductor regions defining an emitter, an intrinsic base, and a collector. An NPN bipolar junction transistor includes two regions of n-type semiconductor material constituting the emitter and collector, and a region of p-type semiconductor material constituting the intrinsic base situated between the two regions of n-type semiconductor material. A PNP bipolar junction transistor includes two regions of p-type semiconductor material constituting the emitter and collector, and a region of n-type semiconductor material constituting the intrinsic base situated between the two regions of p-type semiconductor material. The emitter, intrinsic base, and collector define a pair of p-n junctions, namely a collector-base junction and an emitter-base junction, across which the conductivity type of the respective semiconductor materials changes. A voltage applied across the emitter-base junction controls the movement of charge carriers that produces charge flow between the collector and emitter.

Improved fabrication methods and device structures are needed for a bipolar junction transistor.

SUMMARY

In an embodiment of the invention, a method is provided for fabricating a bipolar junction transistor. The method includes forming a first semiconductor layer on a substrate containing a first terminal, forming an etch stop layer on the first semiconductor layer, and forming a second semiconductor layer on the etch stop layer. The method further includes etching the second semiconductor layer to define a second terminal at a location of an etch mask on the second semiconductor layer. A first material comprising the etch stop layer and a second material comprising the second semiconductor layer are selected such that the second material of the second semiconductor layer is etched at a greater etch rate than the first material of the etch stop layer.

In an embodiment of the invention, a device structure is provided for a bipolar junction transistor. The device structure includes a base layer on the substrate, a first terminal in the substrate, a second terminal on the base layer, and an etch stop layer between the second terminal and the base layer. The etch stop layer is comprised of a first material. The second terminal is comprised of a second material. The first and second materials are selected such that the second material of the second terminal selectively etches relative to the first material of the etch stop layer.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
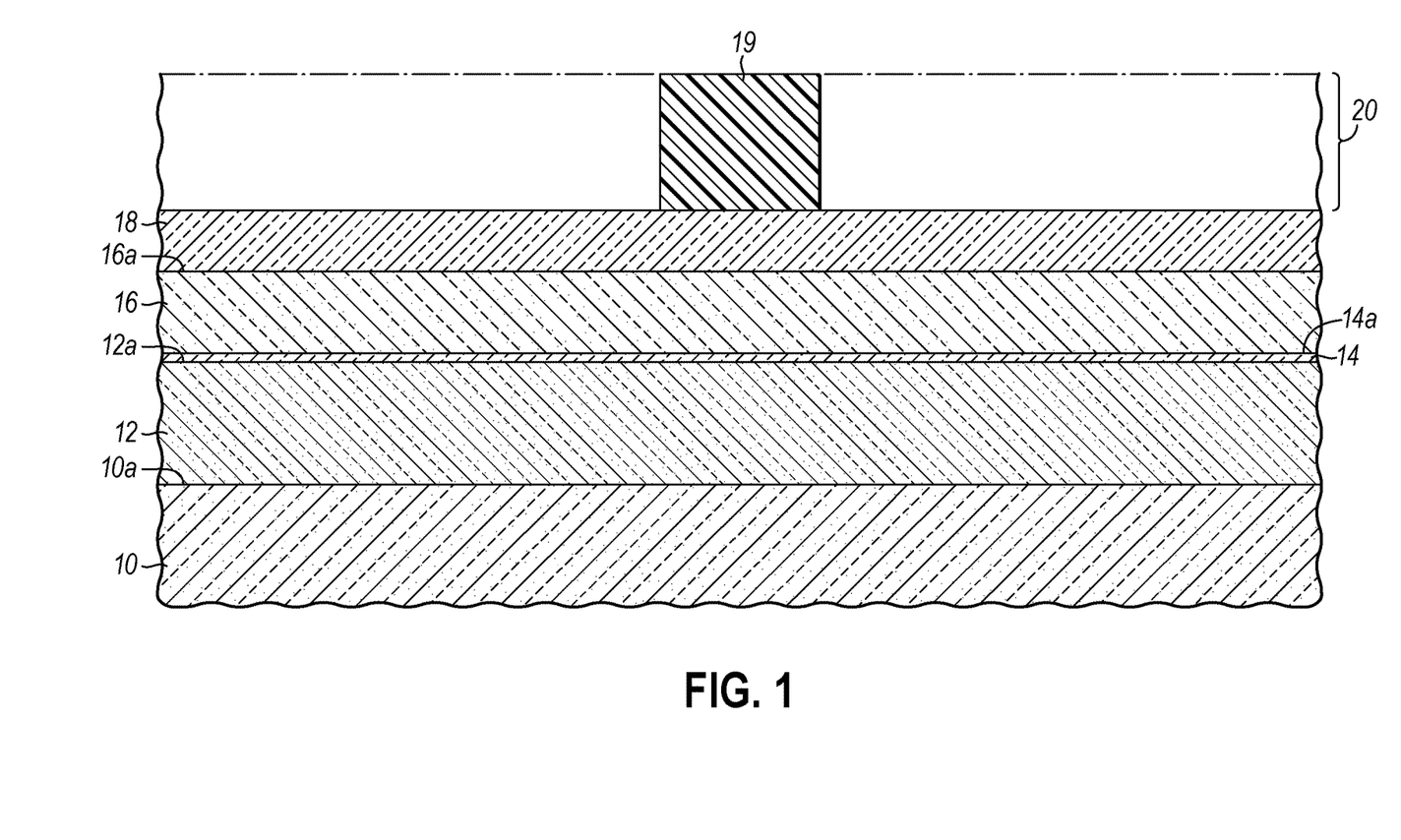
FIGS. 1-7 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single-crystal semiconductor material usable to form the devices of an integrated circuit. The semiconductor material constituting the substrate 10 may include an epitaxial layer at its surface, which may be doped with an electrically-active dopant to alter its electrical properties. For example, the substrate 10 may include an epitaxial layer of single crystal silicon that is epitaxially deposited or grown by chemical vapor deposition (CVD) and that is doped with a concentration of an n-type dopant from Group V of the Periodic Table (e.g., phosphorus (P), arsenic (As), or antimony (Sb)) in a concentration that is effective to impart n-type conductivity.

A base layer 12 is formed as a continuous additive film on a top surface 10a of substrate 10. The base layer 12 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 12 may be uniform across the thickness of base layer 12, or graded and/or stepped across the thickness of base layer 12. If the germanium content is stepped, respective thicknesses of the base layer 12 that are directly adjacent to the substrate 10 and directly adjacent to the top surface 12a may lack a germanium content and may therefore constitute intrinsic layers comprised entirely of silicon. The base layer 12 may comprise a dopant, such as a p-type dopant selected from Group III of the Periodic Table (e.g., boron) in a concentration that is effective to impart p-type conductivity to the semiconductor material of the base layer and, optionally, carbon (C) to suppress the mobility of the p-type dopant.

The base layer 12 may be formed using a low temperature epitaxial (LTE) growth process, such as vapor phase epitaxy (VPE) conducted at a growth temperature ranging from 400° C. to 850° C. Single crystal semiconductor material (e.g., single crystal silicon and/or single crystal SiGe) is epitaxially grown or deposited by the LTE growth process on the top surface 10a of substrate 10. The base layer 12 may have an epitaxial relationship with the single crystal semiconductor material of the substrate 10 in which the crystal structure and orientation of the substrate 10 operates as a template to establish the crystal structure and orientation of the base layer 12 during growth.

An etch stop layer 14 is formed on a top surface 12a of the base layer 12 and an emitter layer 16 is formed on a top surface 14a of the etch stop layer 14. The material comprising the etch stop layer 14 may be selected to etch selectively relative to the material comprising the emitter layer 16 in that the emitter layer 16 has a greater material removal rate (i.e., a greater etch rate) than the etch stop layer 14 for a particular etch chemistry for the etching process chosen to etch the emitter layer 16. In an embodiment in which the base layer 12 and the emitter layer 16 are comprised of semiconductor materials, the etch stop layer 14 is not comprised of a semiconductor material (i.e., the material comprising the etch stop layer 14 is a non-semiconductor).

In one embodiment, the etch stop layer 14 may be comprised of an oxide of silicon that is formed by rapid thermal oxidation (RTO) or by atomic layer deposition (ALD). The thickness of the etch stop layer 14 may be influenced by, among other factors, the process temperature and treatment time, and is selected to be thin in comparison with the thickness of the base layer 12 and the thickness of the emitter layer 16. The thickness of the etch stop layer 14 may be selected such that the etch stop layer 14 functions to reduce hole injection into emitter (thus reducing the base current), but retains a low enough electrical resistance such that the emitter current is not significantly reduced. If the etch stop layer 14 is formed using rapid thermal oxidation, process parameters may include a process temperature range ranging from 700° C. to 1100° C. and a treatment time of 2 minutes to 5 minutes. Rapid thermal oxidation provides precise temperature control and offers short oxidation times when forming the etch stop layer 14.

The emitter layer 16 may be comprised of a different semiconductor material than base layer 12 and may have an opposite conductivity type from the base layer 12. For example, the emitter layer 16 may lack germanium that is present in at least a portion of the base layer 12. In a representative embodiment, the semiconductor material comprising the emitter layer 16 may be polysilicon (i.e. polycrystalline silicon) deposited by CVD, and may contain an n-type dopant in a concentration effective to impart n-type conductivity. The base layer 12 and the emitter layer 16 are significantly thicker than the etch stop layer 14. The emitter layer 16 is not comprised of single crystal semiconductor material due, at the least, to the presence of the etch stop layer 14.

A cap layer 18 comprised of a dielectric material, such as silicon dioxide ($SiO_2$), may be formed on a top surface 16a of the emitter layer 16. In an embodiment in which both the etch stop layer 14 and the cap layer 18 are comprised of oxides of silicon, the material constituting the etch stop layer 14 may be less dense than the material constituting the cap layer 18.

A mask layer 20 may be applied on a top surface 18a of the cap layer 18 and patterned with photolithography to define a feature 19. To that end, the mask layer 20 may comprise a light-sensitive material, such as a photoresist, that is applied as a coating by a spin coating process, pre-baked, exposed to light projected through a photomask, baked after exposure, and developed with a chemical developer to form an etch mask. The feature 19 represents a portion of the mask layer 20 that is located at an intended location for the emitter of the bipolar junction transistor.

Figure 2:
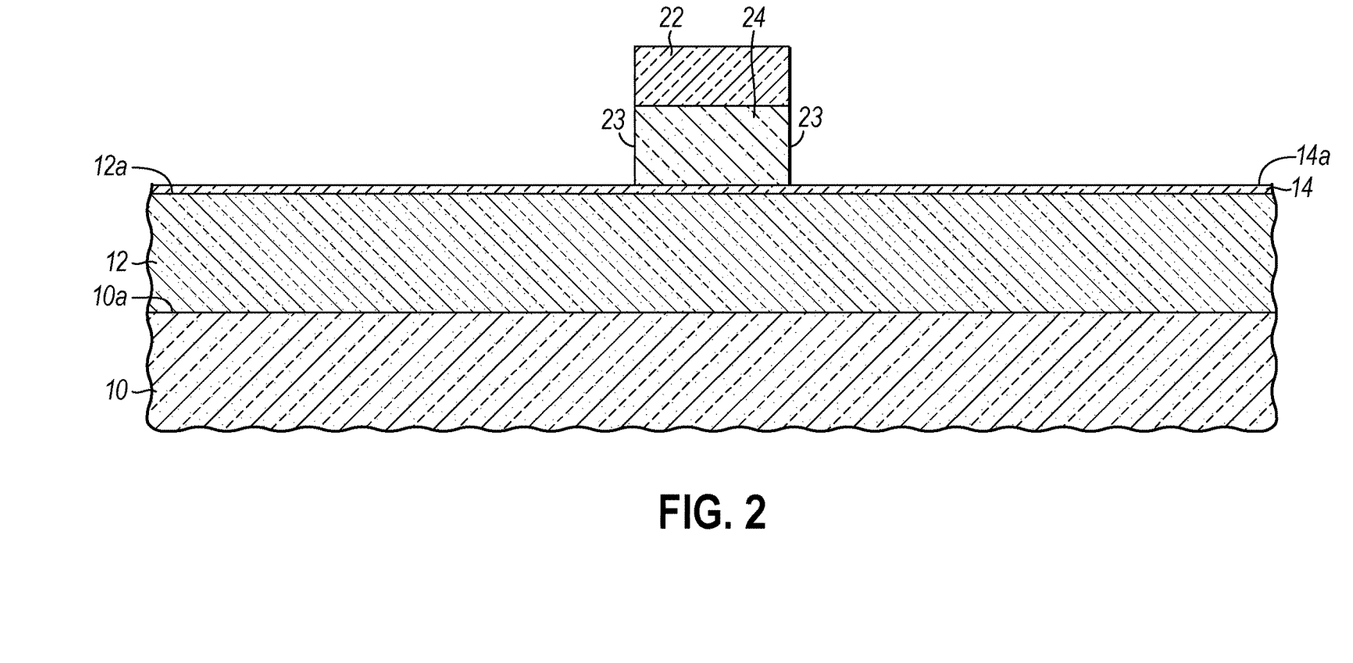

With reference to FIG. 2 in which like reference numerals refer to like features in FIG. 1 and at a subsequent fabrication stage of the processing method, an etching process is used, with the feature 19 of the mask layer 20 present on the top surface 18a of the cap layer 18 as an etch mask, to form a cap 22 from the cap layer 18 at the location of the feature 19. The mask layer 20 may be removed after the cap layer 18 is patterned by the etching process. If comprised of a photoresist, the mask layer 20 and, in particular, feature 19 may be removed by ashing or solvent stripping, followed by a conventional cleaning process.

Another etching process is then used, with the cap 22 and, optionally, the feature 19 of the mask layer 20 present as an etch mask that blocks etching of the underlying semiconductor material, to form an emitter 24 in the form of a residual section of the emitter layer 16. The recipe for the etching process is selected to remove the material of the emitter layer 16 selective to the material of the etch stop layer 14. The etching process may comprise a wet chemical etching process or a dry etching process, such as reactive-ion etching (RIE). The etching process, which may be conducted in a single etching step or multiple steps, relies on one or more etch chemistries to etch the semiconductor material of the emitter layer 16 while substantially not etching the dielectric material of the etch stop layer 14. In one embodiment, the dry etch chemistry may be a hydrogen bromide-based (HBr-based) chemistry. The cap 22 covers the residual section of the emitter layer 16 intended to form the emitter 24 and protects this residual section from removal by the etching process.

The etching process forming the emitter 24 etches the etch stop layer 14 at an etch rate that is less than an etch rate for the emitter layer 16. The etching process forming the emitter 24 may stop on the top surface 14a of the etch stop layer 14 and, as a result, may not penetrate through the etch stop layer 14 to etch the underlying base layer 12. As a result, the etch stop layer 14 protects the underlying base layer 12 from the etching process used to fashion the emitter 24. The base layer 12 and the emitter layer 16 may have similar compositions such that, were the etch stop layer 14 absent, an etching process would remove both semiconductor materials at similar rates, which in turn would provide uncertainty in depth control when etching the emitter layer 16 to form the emitter 24. In this regard, the etch stop layer 14 permits the emitter layer 16 to be etched without also etching the base layer 12 in the absence of precise depth control over the etching process. The ability to precisely control the formation of the emitter 24 promotes self-alignment of the emitter 24 with the subsequently-formed intrinsic base of the bipolar junction transistor.

The etch stop layer 14 may also function to as a marker to provide endpoint detection during the etching process so that the etching process may be interrupted by automatic or human intervention. Upon the complete removal of the unmasked sections of the emitter layer 16 by a dry etching process, the etch stop layer 14 is exposed to the chemically-reactive plasma used during the dry process. As the composition transitions from the material of emitter layer 16 to the material of the etch stop layer 14, the endpoint may be detected as a deviation in a spectral line of a light emission spectrum acquired by an optical spectrometer monitoring the chemically-reactive plasma. Specifically, the spectral line of the light emission spectrum may be observed to change at the transition between layers 14, 16 because of a corresponding change in the composition of the plasma and its light emission. In an embodiment that uses an HBr-based chemistry for the dry etching processing, the wavelength for endpoint detection may be 425 nm. Alternatively, a laser interferometric technique may be used for endpoint detection relying on the etch stop layer 14 as a marker. After the etch stop layer 14 is perceived, any continuation of the etching process may result in slight overetching.

In an alternative embodiment, a selective etching process may be used to eliminate residual semiconductor material of the emitter layer 16 outside of the vicinity of the emitter 24.

Figure 3:
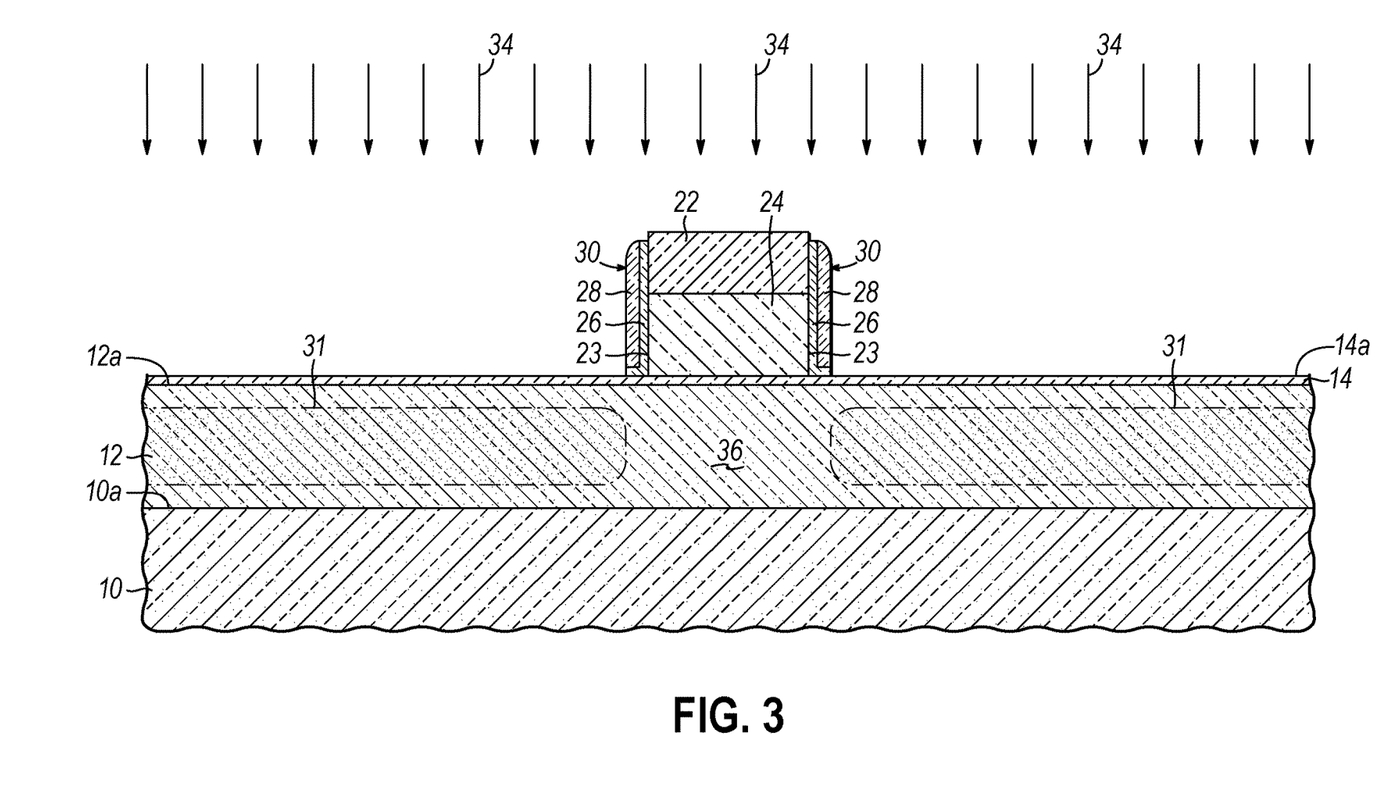

With reference to FIG. 3 in which like reference numerals refer to like features in FIG. 2 and at a subsequent fabrication stage of the processing method, dielectric layers 26, 28, which reproduce the underlying topology, are serially deposited and then etched with an anisotropic etching process to form bi-material spacers 30 on the sidewalls 23 of the emitter 24. The anisotropic etching process, which may be conducted in a single etching step or multiple steps, may rely on one or more RIE etch chemistries to shape the dielectric layers. The dielectric layers 26, 28 may each be comprised of an electrical insulator with a dielectric constant (e.g., permittivity) characteristic of a dielectric material. In one embodiment, the dielectric layer 26 may be comprised of $SiO_2$ deposited by CVD, and the dielectric layer 28 may be comprised of silicon nitride ($Si_3N_4$) deposited using CVD.

A doped region 31 may be formed in a section of the base layer 12 by introducing a dopant into the section of the base layer 12. The dopant, after being activated by an anneal, may increase the electrical conductivity of the semiconductor material of the base layer 12 in the doped region 31 relative to the electrical conductivity of the intrinsic base 36. In one embodiment, the doped region 31 may be formed by implanting ions 34 comprising a p-type dopant with implantation conditions (e.g., kinetic energy and dose) effective to impart a p-type conductivity in the implanted section that is greater than the p-type conductivity of the remainder of the base layer 12. The cap layer 22, emitter 24 and its spacers 30 define a pedestal that covers the underlying portion of the base layer 12, which defines an intrinsic base 36 of the device structure. The pedestal blocks the implanted ions 34 from reaching the intrinsic base. The cap layer 22 operates as an implantation mask that blocks the emitter 24 from receiving a dose of the implanted ions 34. Hence, the conductivity and/or conductivity type of the emitter 24, which has an opposite conductivity type from the intrinsic base 36 and doped region 31, is not altered.

The intrinsic base 36 and the extrinsic base, which is subsequently defined from a portion the doped region 31, are self-aligned relative to the emitter 24. The peripheral boundary between the intrinsic base 36 and the extrinsic base is vertically aligned with the sidewalls 23 of the emitter 24 with a slight outward displacement due to the addition of the spacers 30 prior to implantation. The self-alignment between the emitter 24 and intrinsic base 36 occurs at a transition between the more heavily-doped semiconductor material of the extrinsic base and the less heavily-doped semiconductor material of the intrinsic base 36.

In an alternative embodiment, the process flow may be altered such that the feature 19 of the mask layer 20 is be retained on the cap 20 after the etching processes forming the cap 20 and the emitter 24 are completed. The ion implantation forming the doped region 31 is performed with the feature 19, in conjunction with the cap 20, serving as a composite implant mask that protects the emitter 24 against receiving a dose of the ions 34. This additional masking may permit a reduction in the thickness of the cap 20. After the implant is used to form doped region 31, an etching process is used to laterally trim the emitter 24. After the lateral dimension of the emitter 24 is reduced, the spacers 30 are formed on the sidewalls 23 of the emitter 24.

Figure 4:
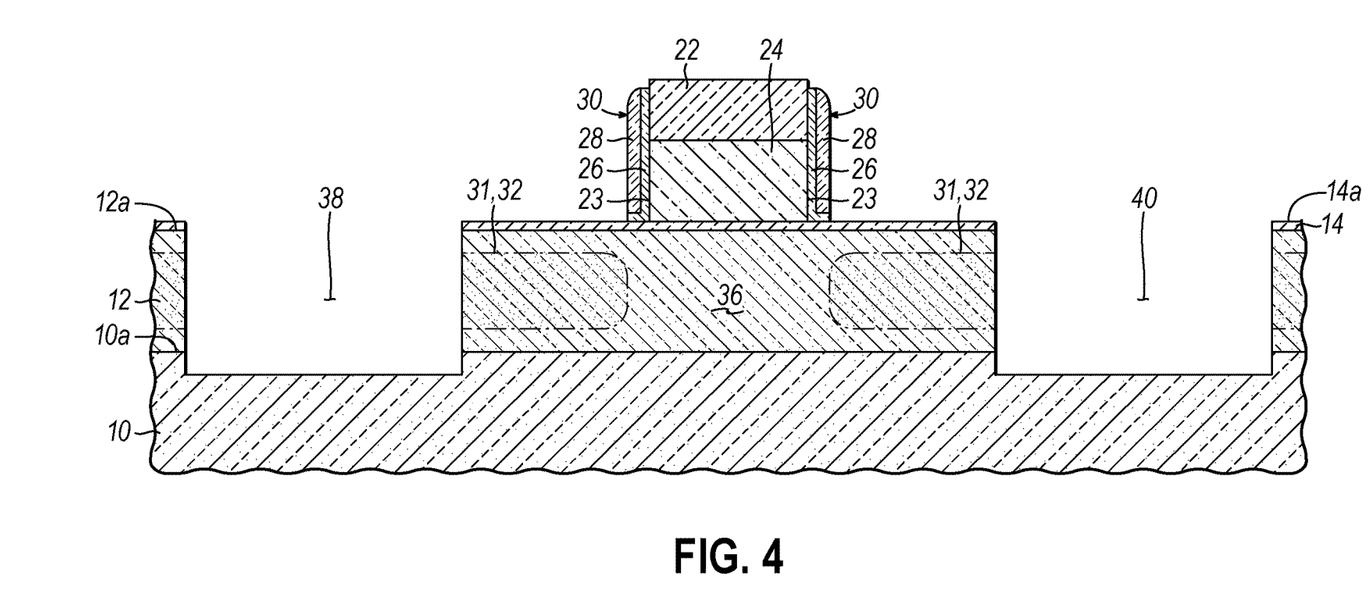

With reference to FIG. 4 in which like reference numerals refer to like features in FIG. 3 and at a subsequent fabrication stage of the processing method, trenches 38, 40 are defined that extend completely through the base layer 12, and to a shallow depth into the substrate 10. The trenches 38, 40 are spaced laterally from the emitter 24, and may be interconnected to surround the emitter 24 or, alternatively, may be parallel and lack any interconnection. The etching process forming the trenches 38, 40 may comprise a wet chemical etching process or a dry etching process, such as reactive-ion etching (RIE), and may rely on a hardmask with openings defining the location for the trenches 38, 40. The etching process, which may be conducted in a single etching step or multiple steps, relies on one or more etch chemistries to etch the semiconductor materials of the base layer 12 and substrate 10 while substantially not etching the dielectric material of the hardmask layer, and may comprise one or more timed etches.

The trenches 38, 40 laterally truncate the base layer 12 to define a residual section of the base layer 12 in which the intrinsic base 36 and the extrinsic base 32 of the device structure are defined. The extrinsic base 32 of the device structure is defined from the doped region 31 in a section of the truncated base layer 12. As mentioned hereinabove, the intrinsic base 36 is defined by another section of the base layer 12 that is masked during ion implantation with ions 34. The extrinsic base 32 is arranged peripheral to the intrinsic base 36 within the base layer 12, and peripheral to the emitter 24 with which the intrinsic base 36 is self-aligned. The truncation of the base layer 12 by the formation of the trenches 38, 40 occurs in the process flow after the emitter 24 is formed from the emitter layer 16.

Figure 5:
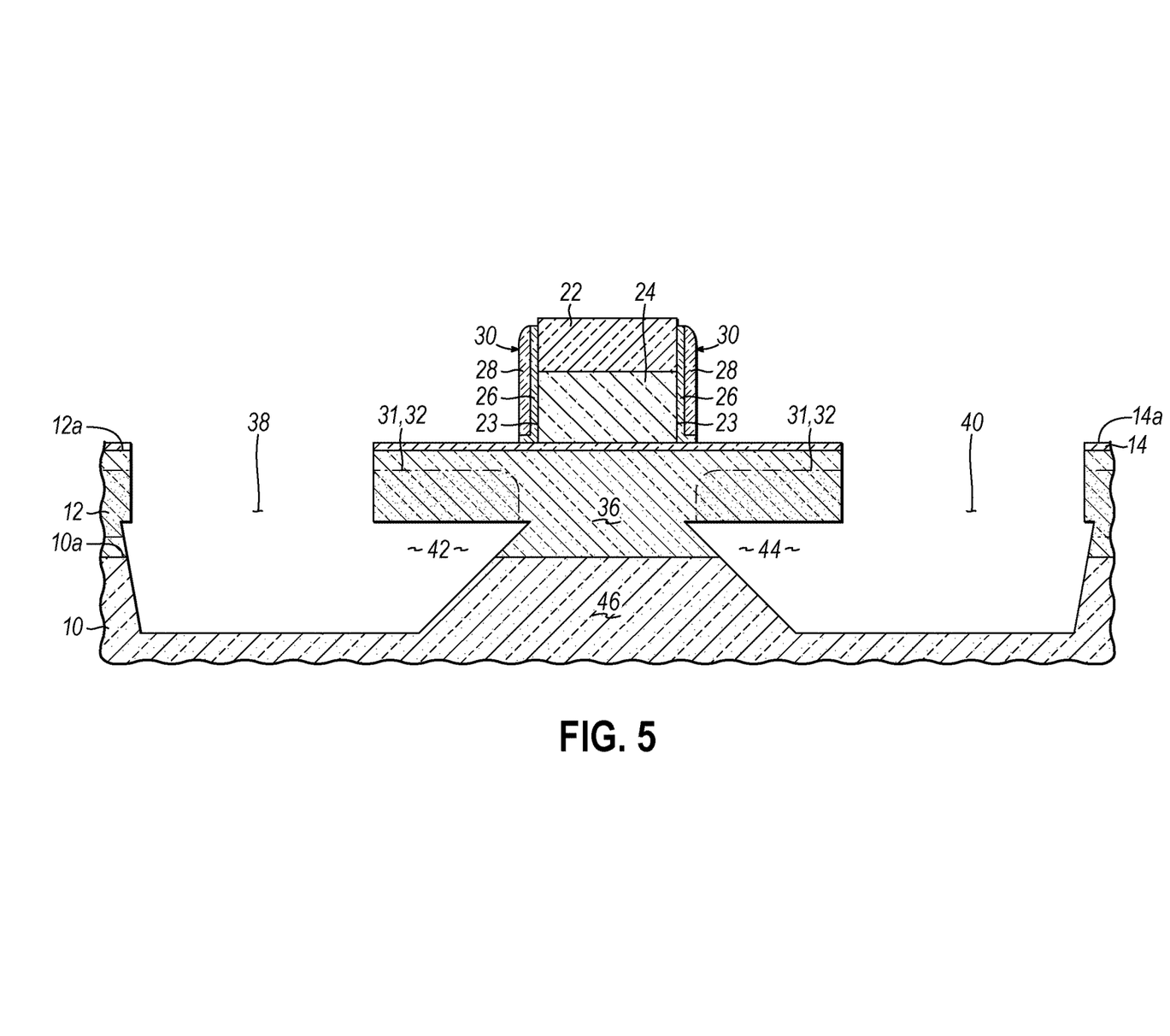

With reference to FIG. 5 in which like reference numerals refer to like features in FIG. 4 and at a subsequent fabrication stage of the processing method, cavities 42, 44 are defined in substrate 10 that undercut the base layer 12. The cavities 42, 44 are formed by increasing the depth and width of the portion of trenches 38, 40 in the substrate 10 with a wet chemical etching process, a dry etching process, or a combination of wet chemical and dry etching processes selective to at least a partial thickness of the material of the base layer 12. The selective etching may originate from the use of a composition-sensitive etchant that etches the semiconductor materials of the substrate 10 at a greater etch rate than the material of the base layer 12. In the representative embodiment, a thin portion of the base layer 12 having a composition similar to the composition of the substrate 10 and bordering the cavities 42, 44 is removed by the etching process.

The etching process may be controlled by selecting factors such as the etchant chemistry, duration, etc. Each etching process may be combined with implantation damage to the semiconductor material and/or impurity-doping of the semiconductor material to alter etch rates and, thereby, the profile of the cavities 42, 44. The etching process may further rely on wafer orientation and anisotropic etching processes that exhibit different etch rates for different crystallographic directions (as specified, for example, by Miller indices) in a single-crystal semiconductor material. In one embodiment, the vertical and lateral etch rates may be identical when the cavities 42, 44 are formed.

A collector 46 is laterally bounded in the substrate 10 between the cavities 42, 44. The collector 46 is comprised of the semiconductor material of the substrate 10, and may be selectively implanted with an impurity to further enhance its electrical conductivity. In one embodiment, the collector 46 may comprise n-type semiconductor material of an epitaxial layer of the substrate 10 and may be optionally implanted with an n-type dopant to enhance its electrical conductivity. The collector 46 is defined at a different point in the process flow than the emitter 24 and, in particular, is defined in the process flow after the emitter 24 is formed.

Figure 6:
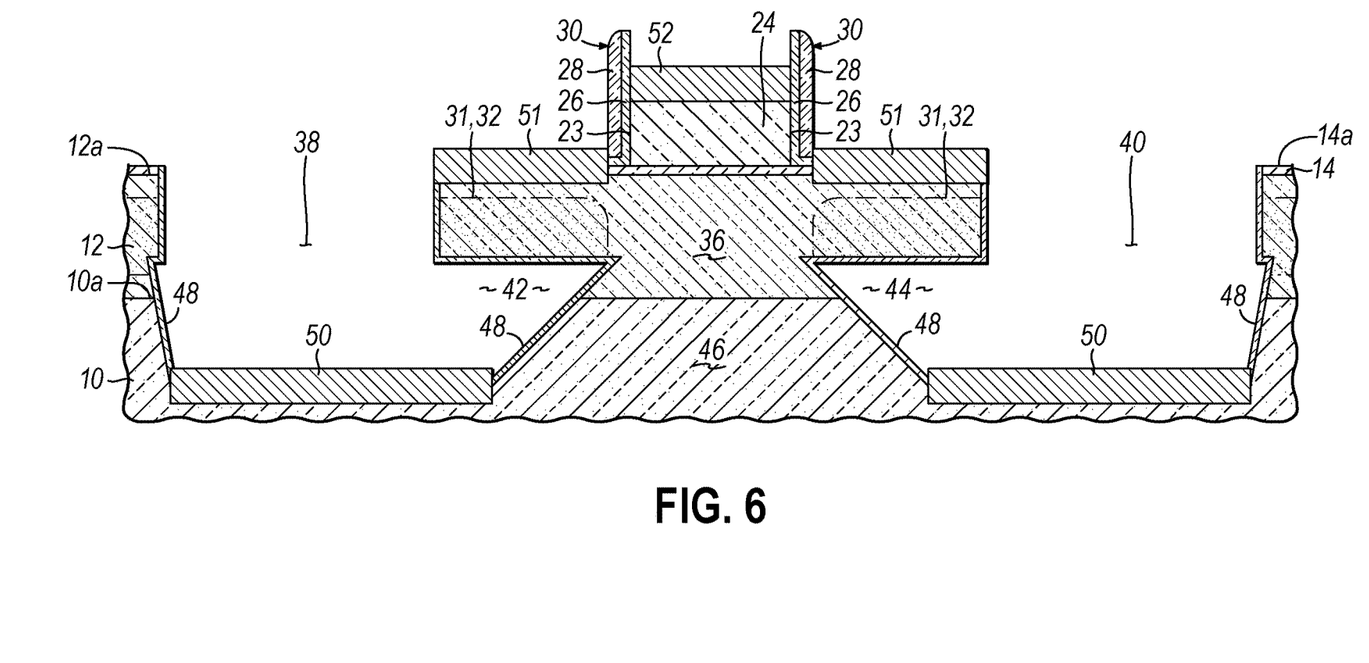

With reference to FIG. 6 in which like reference numerals refer to like features in FIG. 5 and at a subsequent fabrication stage of the processing method, a dielectric layer 48 is formed as a passivation film on the surfaces bounding the cavities 42, 44, and on the surfaces of the base layer 12 not covered by the emitter 24 and its spacers 30 from above and by the collector 46 from below. The dielectric layer 48 may be comprised of an electrical insulator with a dielectric constant (e.g., permittivity) characteristic of a dielectric material. In one embodiment, the dielectric layer 48 may be comprised of a low temperature oxide deposited using CVD.

A directional anisotropic etching process, such as RIE, may be used to preferentially remove the electrical insulator of dielectric layer 48 from horizontal surfaces. If the dielectric layer 48 and the cap 22 are comprised of silicon dioxide, an oxide preclean removal may be used. If the cap 22 is comprised of a different material, such as silicon nitride, and the dielectric layer 48 is comprised of silicon dioxide, then the cap 22 may not be removed by the oxide preclean removal so that the underlying emitter 24 is not silicided in a subsequent stage of the process flow.

Sections 50 of a silicide layer are formed on the horizontal surfaces inside the cavities 42, 44 that are not covered by the dielectric layer 48 after etching, and may be subsequently used in the process flow to contact the collector 46. Sections 51 of the silicide layer are formed on the top surface of the base layer 12 not covered by the emitter 24 and its spacers 30, and may be subsequently used in the process flow to contact the extrinsic base 32 and thereby the intrinsic base 36. A section 52 of the silicide layer may be formed on the top surface of the emitter layer 16, and may be subsequently used in the process flow to contact the emitter 24. The silicide layer is not formed on surfaces that are covered by the dielectric layer 48 and spacers 30.

The sections 50-52 of the silicide layer may be formed by a silicidation process that involves one or more annealing steps to form a silicide phase by reacting a layer of silicide-forming metal and the semiconductor material contacting the silicide-forming metal. Candidate refractory metals for the silicide-forming metal include, but are not limited to, titanium (Ti), cobalt (Co), or nickel (Ni).

The silicide-forming metal may be deposited by, for example, a CVD process or a physical vapor deposition (PVD) process. A capping layer comprised of a metal nitride, such as sputter-deposited titanium nitride (TiN), may be applied to cap the silicide-forming metal. An initial annealing step of the silicidation process may form a metal-rich silicide that consumes the silicide-forming metal and then form silicides of lower metal content that grow by consuming the metal-rich silicides. Following the initial annealing step, any remaining silicide-forming metal and the optional capping layer may be removed with one or more wet chemical etches. The sections 50-52 of silicide may then be subjected to an additional annealing step at a higher temperature to form a lower-resistance silicide phase.

Figure 7:
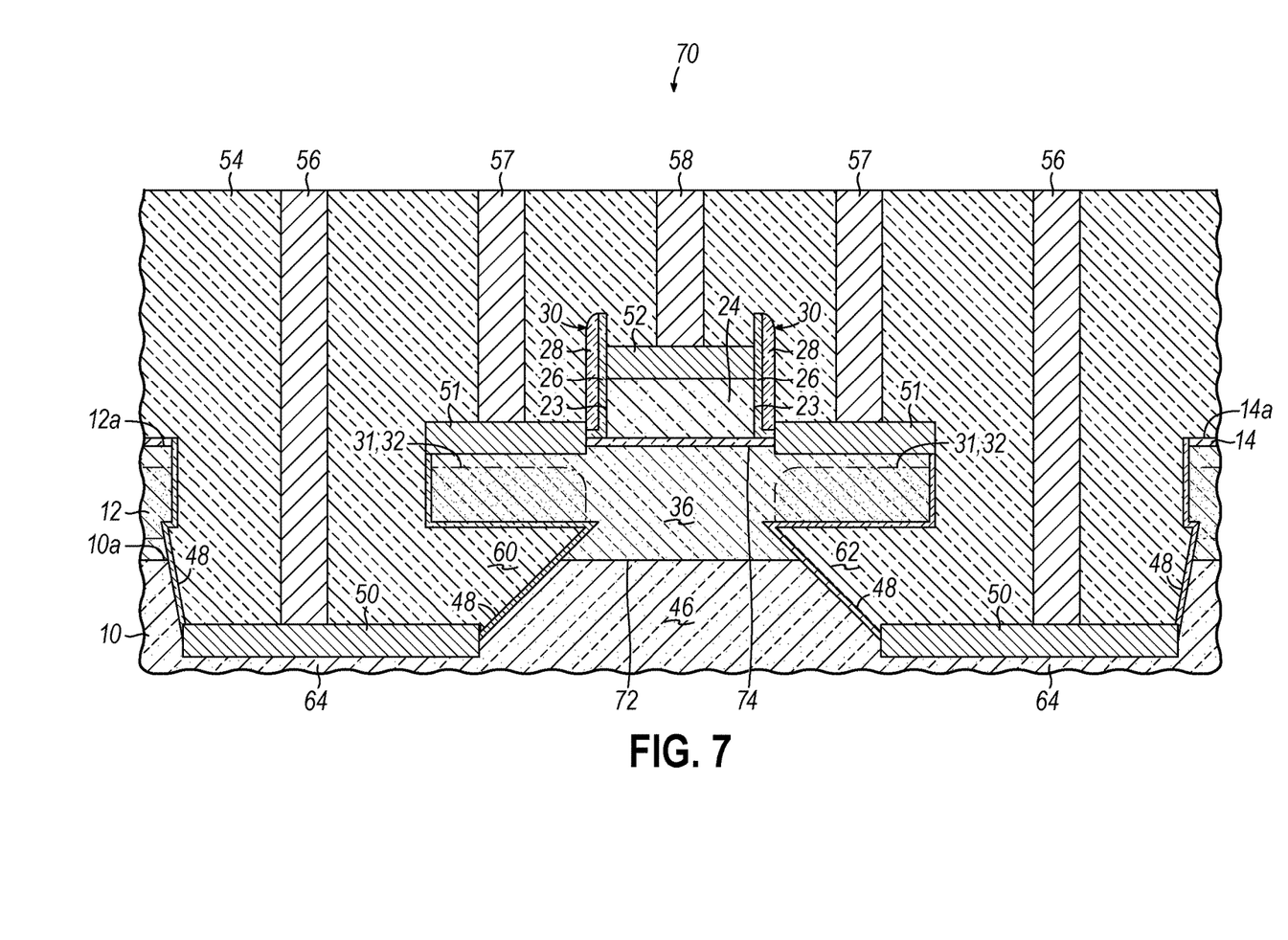

With reference to FIG. 7 in which like reference numerals refer to like features in FIG. 6 and at a subsequent fabrication stage of the processing method, middle-end-of-line (MEOL) processing, which includes formation of a dielectric layer 54, contacts 56, 57, 58, and wiring, follows to define a local interconnect structure. Candidate inorganic dielectric materials for the dielectric layer 54 may include, but are not limited to, borophosphosilicate glass (BPSG), silicon dioxide ($SiO_2$), silicon nitride ($Si_3N_4$), fluorine-doped silicon glass (FSG), and combinations of these and other dielectric materials. Dielectric layer 54 may be deposited by any number of techniques, such as sputtering, spin-on application, or CVD.

Portions of the dielectric layer 54 may fill the trenches 38, 40 and the cavities 42, 44 to define isolation regions 60, 62 that laterally flank the collector 46 and define a peripheral boundary for the collector 46. Portions of the isolation regions 60, 62 undercut the base layer 12, which may improve device performance as discussed hereinbelow. A sub-collector 64, which is comprised of a doped region of the semiconductor material of substrate 10, extends laterally from the collector 46 beneath the isolation regions 60, 62. The sub-collector 64 couples the collector 46 with the sections 50 of the silicide layer and the contacts 56. The sub-collector 64 may be formed by ion implanting the substrate 10 with a dopant before an epitaxial layer is formed as an overlying part of the substrate 10. The semiconductor materials of the sub-collector 64 and the collector 46 have the same conductivity type (e.g., n-type conductivity). The presence of the isolation regions 60, 62 may operate to eliminate the need for conventional shallow trench isolation regions to electrically isolate the bipolar junction transistor 70 from its surroundings on the chip.

Contacts 57 extend through the dielectric layer 54 to contact the sections 51 of silicide layer and, thereby, to be coupled with the base layer 12 (i.e., the extrinsic base 32 and the intrinsic base 36). Contacts 58 extend through the dielectric layer 54 to contact the section 52 of silicide layer and, thereby, to be coupled with the emitter 24.

The resulting device structure is a bipolar junction transistor 70 that includes the emitter 24, the collector 46, and the intrinsic base 36 vertically between the emitter 24 and collector 46. The intrinsic base 36, the collector 46 comprising one terminal, the emitter 24 comprising the other terminal, and the etch stop layer 14 have a vertical arrangement relative to the top surface 10a of the substrate 10. The collector 46 of the bipolar junction transistor 70 is coextensive with one surface of the intrinsic base 36 along a junction 72. The emitter 24 of the bipolar junction transistor 70 is coextensive with an opposite surface of the intrinsic base 36 along a junction 74. The bipolar junction transistor 70 may be characterized as a heterojunction bipolar transistor (HBT) if two or all three of the emitter 24, the collector 46, and the intrinsic base 36 are comprised of different semiconductor materials.

The undercutting of the base layer 12 and the narrowing of the collector 46 by the isolation regions 60, 62 permits the area of the intrinsic base 36 proximate to the emitter 46 and the area of the intrinsic base 36 proximate to the collector 46 to be selected independent of each other. As a result, the areas may be asymmetrical on the emitter-side of the intrinsic base 36 and on the collector-side of the intrinsic base 36 and, in one embodiment, the area on the collector-side of the intrinsic base 36 may be less than the area on the emitter-side of the intrinsic base 36.

A residual portion of the etch stop layer 14 remains in the final device structure for the bipolar junction transistor 70 at the junction 74 defining the interface between the emitter 24 and intrinsic base 36. The bipolar junction transistor 70 is functional in the presence of the etch stop layer 14 because the material comprising the etch stop layer 14 has an electrical resistance more characteristic of a conductor than an electrical insulator. If the etch stop layer 14 is formed from an oxide of silicon, this reduced electrical resistance may be the consequence of the etch stop layer 14 being thin and/or lacking full material density.

The bipolar junction transistor 70 may exhibit improved device performance as measured by figures of merit such as the cut-off frequency $f_T$ and the maximum oscillation frequency $f_{max}$. The self-alignment of the emitter 24 and the intrinsic base 36, which is promoted by the inclusion of the etch stop layer 14 between the base layer 12 and the emitter layer 16, may reduce the base resistance (Rb). The isolation regions 60, 62, which undercut the base layer 12, may reduce the collector-to-base parasitic capacitance (Ccb) by reducing the area of contact between the intrinsic base 36 and collector 46. The parasitic capacitance between the extrinsic base 32 and the collector 46 is proportional to the dielectric constants of the intervening materials. In this instance, the isolation regions 60, 62 decrease the parasitic capacitance between the extrinsic base 32 and collector 46. The self-aligned introduction of dopant into the base layer 12 for define the extrinsic base 32 may also operate to reduce both the base resistance and the collector-to-base parasitic capacitance.

During the front-end-of-line (FEOL) portion of the fabrication process, the device structure of the bipolar junction transistor 70 is replicated across at least a portion of the surface area of the substrate 10. In BiCMOS integrated circuits, complementary metal-oxide-semiconductor (CMOS) transistors may be formed using other regions of the substrate 10. As a result, both bipolar and CMOS transistors may be available on the same substrate 10. Standard back-end-of-line (BEOL) processing follows, which includes formation of dielectric layers, via plugs, and wiring for an interconnect structure coupled by the local interconnect structure with the bipolar junction transistor 70, as well as other similar contacts for additional device structures like bipolar junction transistor 70 and CMOS transistors included in other circuitry fabricated on the substrate 10.

In an alternative embodiment, the function and identity of the emitter and the collector as terminals of the bipolar junction transistor 70 may be exchanged to provide a collector-up configuration rather than the emitter-up configuration. In a collector-up configuration, the collector 46 would operate as an emitter and the emitter 24 would function as a collector.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
   forming a first semiconductor layer on a substrate containing a first terminal of the bipolar junction transistor;
   forming an etch stop layer on the first semiconductor layer;
   forming a second semiconductor layer on the etch stop layer;
   forming an etch mask on the second semiconductor layer; and
   after the etch mask is formed on the second semiconductor layer, etching the second semiconductor layer to form a second terminal of the bipolar junction transistor at the location of the etch mask on the second semiconductor layer;
   forming an isolation region in the substrate that defines a peripheral boundary for the first terminal; and
   forming a contact that is coupled with the second terminal,
   wherein a first material comprising the etch stop layer and a second material comprising the second semiconductor layer are selected such that the second material of the second semiconductor layer etches during the etching process at a greater etch rate than the first material of the etch stop layer, and a portion of the etch stop layer is located between the second terminal and the first semiconductor layer; and
   wherein the isolation region includes a portion extending laterally into a cavity beneath the first semiconductor layer, the first semiconductor layer includes an intrinsic base and an extrinsic base that is arranged peripheral to the intrinsic base, the extrinsic base is vertically disposed over the isolation region, the intrinsic base is coupled with the first terminal along a first junction, and the intrinsic base is coupled with the second terminal along a second junction.

2. The method of claim 1 wherein the etching process used to etch the second semiconductor layer to form the second terminal has an etch chemistry that stops on the etch stop layer.

3. The method of claim 1 wherein etching the second semiconductor layer to form the second terminal of the bipolar junction transistor at the location of the etch mask on the second semiconductor layer comprises:
   detecting an endpoint using the etch stop layer as a marker for the etching process used to etch the second semiconductor layer to define the second terminal.

4. The method of claim 1 wherein the second material of the second semiconductor layer is comprised of polysilicon, and the first semiconductor layer is comprised of single-crystal silicon germanium having an epitaxial relationship with the substrate.

5. The method of claim 1 wherein the first material of the etch stop layer is comprised of an oxide of silicon, and forming the etch stop layer on the first semiconductor layer comprises:
   depositing the oxide of silicon using rapid thermal oxidation.

6. The method of claim 1 wherein the first terminal is a collector of the bipolar junction transistor, and the second terminal is an emitter of the bipolar junction transistor.

7. The method of claim 1 wherein the first material is comprised of an oxide of silicon.

8. The method of claim 1 wherein the first material is comprised of a non-semiconductor material.

9. The method of claim 1 wherein the first terminal is a collector of the bipolar junction transistor, and the second terminal is an emitter of the bipolar junction transistor.

10. The method of claim 1 wherein the first terminal is an emitter of the bipolar junction transistor, and the second terminal is a collector of the bipolar junction transistor.

11. A method of fabricating a bipolar junction transistor, the method comprising:
forming a first semiconductor layer on a substrate containing a first terminal;
forming an etch stop layer on the first semiconductor layer;
forming a second semiconductor layer on the etch stop layer;
etching the second semiconductor layer to form a second terminal at a location of an etch mask on the second semiconductor layer;
covering the second terminal with a cap; and
implanting the first semiconductor layer with ions to form a doped region for an extrinsic base in a first section of the first semiconductor layer not covered by the second terminal,
wherein the cap blocks implantation of the ions into the second terminal, and a first material comprising the etch stop layer and a second material comprising the second semiconductor layer are selected such that the second material of the second semiconductor layer etches at a greater etch rate than the first material of the etch stop layer.

12. The method of claim 11 wherein an intrinsic base is located in a second section of the first semiconductor layer covered by the second terminal.

13. A method of fabricating a bipolar junction transistor, the method comprising:
forming a first semiconductor layer on a substrate containing a first terminal;
forming an etch stop layer on the first semiconductor layer;
forming a second semiconductor layer on the etch stop layer;
etching the second semiconductor layer to form a second terminal at a location of an etch mask on the second semiconductor layer; and
after the second terminal is formed by etching the second semiconductor layer, etching a trench extending through the etch stop layer and the first semiconductor layer into the substrate so that the first semiconductor layer is truncated,
wherein a first material comprising the etch stop layer and a second material comprising the second semiconductor layer are selected such that the second material of the second semiconductor layer etches at a greater etch rate than the first material of the etch stop layer.

14. The method of claim 13 further comprising:
covering the second terminal with a cap; and
implanting a first section of the first semiconductor layer not covered by the second terminal with ions to form an extrinsic base,
wherein the cap blocks implantation of the ions into the second terminal.

15. The method of claim 14 wherein an intrinsic base is defined in a second section of the first semiconductor layer covered by the second terminal during implantation of the ions.

16. The method of claim 14 further comprising:
etching the substrate at a greater etch rate than the first semiconductor layer so that a portion of the trench in the substrate is widened to define a cavity undercutting at least the first section of the first semiconductor layer; and
filling the trench and the cavity with a dielectric material to define a trench isolation region located at least in part beneath the extrinsic base.

17. The method of claim 4 wherein detecting the endpoint using the etch stop layer as the marker for the etching process used to etch the second semiconductor layer to define the second terminal comprises:
detecting a deviation in a spectral line of a light emission spectrum acquired by an optical spectrometer monitoring a chemically-reactive plasma used in the etching process.

18. The method of claim 13 wherein the first terminal is a collector of the bipolar junction transistor, and the second terminal is an emitter of the bipolar junction transistor.

* * * * *